United States Patent
San et al.

(10) Patent No.: US 7,631,423 B2
(45) Date of Patent: Dec. 15, 2009

(54) METHOD AND PROCESS FOR EMBEDDING ELECTRICALLY CONDUCTIVE ELEMENTS IN A DIELECTRIC LAYER

(75) Inventors: Lim Siong San, Singapore (SG); Neo Mok Choon, Singapore (SG); Kevin Lim, Singapore (SG); Kelvin Yeow, Singapore (SG); Tan Kwang Chiah, Singapore (SG)

(73) Assignee: Sanmina-Sci Corporation, San Jose, CA (US)

( * ) Notice: Subject to any disclaimer, the term of this patent is extended or adjusted under 35 U.S.C. 154(b) by 439 days.

(21) Appl. No.: 11/353,725

(22) Filed: Feb. 13, 2006

(65) Prior Publication Data
US 2007/0187237 A1    Aug. 16, 2007

(51) Int. Cl.
 *H05K 3/02*    (2006.01)
 *H05K 3/10*    (2006.01)
(52) U.S. Cl. ............... 29/846; 29/830; 29/831; 29/835; 29/842; 29/843; 29/847; 29/852; 257/E21.705; 257/E23.178
(58) Field of Classification Search .......... 29/846, 29/830, 831, 835, 842, 843, 847, 852; 257/700, 257/E21.705, E23.178
See application file for complete search history.

(56) References Cited
U.S. PATENT DOCUMENTS

| | | | |
|---|---|---|---|
| 5,079,069 A | 1/1992 | Howard et al. | |
| 5,155,655 A | 10/1992 | Howard et al. | |
| 5,231,757 A | 8/1993 | Chantraine et al. | |
| 5,388,328 A | 2/1995 | Yokono et al. | |
| 5,457,881 A | 10/1995 | Schmidt | |
| 5,736,681 A | 4/1998 | Yamamoto et al. | |
| 6,025,995 A * | 2/2000 | Marcinkiewicz | 361/760 |
| 6,063,647 A | 5/2000 | Chen et al. | |
| 6,705,003 B2 | 3/2004 | Motomura et al. | |
| 6,713,685 B1 | 3/2004 | Cotton | |
| 6,729,022 B2 * | 5/2004 | Kurita et al. | 29/846 |
| 6,791,036 B1 | 9/2004 | Chen et al. | |
| 2003/0064325 A1 | 4/2003 | Chou et al. | |
| 2004/0154162 A1 | 8/2004 | Lee et al. | |

* cited by examiner

*Primary Examiner*—Thiem Phan
(74) *Attorney, Agent, or Firm*—Julio M. Loza; Loza & Loza, LLP (57) ABSTRACT

A method is provided for fabricating a multilayer printed circuit board, including embedded electrically conductive elements formed as part of the fabrication of the layers of the printed circuit board. An insulating layer and a conductive layer are then pressed over the electrically conductive elements such that the electrically conductive elements protrude from the surface of the conductive layer. A mechanical process is the applied to remove these protrusions to expose the embedded electrically conductive elements. An electrically conductive undercoat may be applied over the surface of the conductive layer and a second circuit pattern is formed over the electrically conductive undercoat.

23 Claims, 5 Drawing Sheets

METHOD AND PROCESS FOR EMBEDDING ELECTRICALLY CONDUCTIVE ELEMENTS IN A DIELECTRIC LAYER

FIELD

Various embodiments of the invention pertain to manufacturing processes for printed circuit boards. More specifically, manufacturing methods, processes and techniques for embedding electrically conductive elements in a dielectric layer of multilayer circuit boards are disclosed.

BACKGROUND

Early printed circuit boards comprised single-sided composite circuit boards designed for mounting electronic components and connecting the components through wiring circuits running on one surface of the circuit board. As the complexity of electronic circuits grew, so did the need to make more electronic connections on a circuit board. This resulted in the manufacturing of double-sided printed circuit boards capable of having circuits and electronic connections on two surfaces of the circuit boards.

Many recent electronic systems have far more complex circuits, densely populated with multiple components and wiring traces, which are severely limited by having only two surfaces to make all the electrical connections. To create more circuit connections in a smaller circuit board area, multilayer printed circuit boards were developed.

The conventional method of manufacturing a multilayer printed circuit board involves creating circuit board connections using plated through-holes or vias. Circuit networks or traces are formed in different layers that are connected to each other at a common point where a connecting pad is placed. A hole is drilled through the connecting pad and an electrically conductive layer is added to the hole wall (e.g., using a plating or other process) so that two or more circuits on different layers are electrically connected together. In addition to making the necessary connections between layers, a hole may serve an additional function of connecting to components. That is, a hole may serve to receive a terminal or lead from an electrical component, for instance.

With the introduction of surface mounted technology, component holes make up a lesser quantity of all drilled holes in highly complex circuit boards. A majority of the plated through holes, also known as via holes, are mostly used for electrical connections between circuit layers.

Drilling a mechanical via hole through a stack of multilayer printed circuit boards wastes valuable board space because of the sizes of the via holes that can be cost effectively drilled, the large capture pads required for high yield manufacturing and the lost space on layers that do not need an interconnection at all of the points drilled. As a result, vertical interconnection on a layer-to-layer basis has gained in popularity among multilayer printed circuit board designers and manufacturer.

Microvias, which have a smaller opening than traditional vias, are formed using such techniques as laser, photolithography and plasma etching and have been known and/or used by designers, manufacturers, and/or fabricators. However, there is a lot of technical know-how involved in reliably and consistently manufacturing microvias. Take for example, the process of electroless copper deposition which is a common process for seeding a microvia wall before a thicker layer of electrolytic copper is plated over the microvia wall. The circuit boards or substrates through with the microvia holes are formed are typically treated with a swelling agent, a permanganate oxidizer, a reducing agent to reduce the permanganate residue, conditioned with a conditioning agent, microetched to remove the conditioning agent, catalyzed with a Palladium-Tin (Pd-Sn) colloid, treated with hydrochloric acid to expose the Pd and finally being plated. The plating solution typically contains a reducing agent (e.g., formaldehyde or hypophosphite), copper salts and a chelating agent (e.g., EDTA, alkanol amines or tartarates) to keep the copper salt in solution. These chemical processes typically employ two to three rinses in between each process. To achieve reliability and consistency, it is necessary for each chemical process and its respective rinses to perform their relevant functions correctly within the tiny microvias, not most of the time, but in every bath every time. Hence, tight process control with well designed equipment is necessary to make reliable microvias consistently.

In addition to the reliability difficulties in plating microvias, there are other setbacks. For example, chemicals trapped within the microvias may lead to outgassing during the assembly process and additional potential reliability problems.

As the electronic industry's demand for portability, smaller form factors, more built-in functions, and more sophisticated electronic systems grows, the quest to design more circuit connections within a smaller printed circuit board area continues.

U.S. Pat. No. 5,231,757, by Chantraine et al., discloses the use of via studs for a multilayer structure formed on a uniform metal layer that is subsequently etched to form conductors for the multilayer structure. A dielectric layer then covers the entire surface inclusive of the studs. The tips of the studs are then exposed through the dielectric layer by plasma or mechanical means. It is noted the dielectric employed, even though not specified, suggest a non-reinforced material. The embodiment illustrated in the patent is based on polyamic acid as a liquid coat, which is subsequently polymerized to become polyimide.

U.S. Pat. No. 5,457,881, by Schmidt, discloses the protrusions with a distal ends that penetrate a dielectric layer. Even though not specified, the patent suggests that the dielectric layer is made from a non-reinforce material, which conceptually allows the protrusions to penetrate through the dielectric layer. The use of a non-reinforced dielectric layer is undesirable for many modern circuits which tend to use fiberglass reinforced dielectric layers.

The disadvantages of the processes disclosed U.S. Pat. Nos. 5,231,757 and 5,457,881, lies on the necessity to use an appropriate dielectric. Conventional dielectric materials for printed circuit boards, commonly known as prepreg, typically include resin with glass cloth reinforcement. It is easy for conductive studs, protrusions, or bumps to penetrate a pure resin dielectric layer. However, it is relatively difficult for these conductive studs, protrusions, or bumps to penetrate the embedded glass cloth in the prepreg.

U.S. Pat. No. 5,736,681, to Yamamoto et al., discloses a method for making interconnections through a conventional reinforced prepreg layer. Conductive bumps are formed, typically by printing of paste or any other means, to create a substantially conical bump. The interconnections are made in a two stage press. In a first pressing stage, a metal press plate is used to press the bumps to the prepreg so that they penetrate through the resin sheet layer, including the reinforcing layer. A secondary press stage is used to electrically connect the tips of the conductive bumps, previously pressed through the resin sheet, to a metal layer designed for making electrical contact with the bumps. To ensure plastic deformation of the bump tips, pressing plates on both sides are made of a material with little or no compression such as metal, heat resistant hard resin or ceramics. The plastically deformed-surface of the bump generates an inner, fresh active metal surface for bonding.

U.S. Pat. No. 6,705,003, by Motomura et al., discloses an additional step to the method of Yamamoto, of plasma cleaning the tip of the bump after the first press and before the second press. Even-height conical bumps are disclosed whose tips are deformed during the second press stage. Since the height of the bump has to be "substantially uniform", this condition creates additional difficulties or additional processes in the creation of bumps through a bump plating process. In fact, most bumps are formed by creating a full conductive layer followed by etching away the unwanted metal to achieve the even height bumps. This is wasteful of the material used for the conductive layer.

Thus, conventional processes for forming vias on multilayer circuit boards typically require significant precision and expertise to achieve reliability and consistency. However, the inherent issues with microvias includes difficulties in processing, expensive processing machines, additional cost for use of specialty material such as laser drillable prepreg or resin-coated copper foil and chemical traps in the completed microvias. In addition, the size of microvias consumes much needed surface space on high-density, multilayer circuit boards.

Several attempts have been made to do away with microvias. These methods are not widely used due to (a) most of these alternative methods use a non-reinforced dielectric layer, (b) a metallization process is typically included to form the conductive layer over the dielectric layer, and/or (c) the pressing of substrates tends to be excessively complicated and require the conducting element to be of a fixed size and/or substantially uniform shape.

SUMMARY

Various aspects of the present invention may improve the manufacturing of circuit board interconnection elements (e.g., studs, vias, etc.), by eliminating the need to have electrically conductive elements (e.g., bumps) be of substantially uniform height. Additionally, the present invention operates with a dielectric layer (e.g., prepreg) having embedded glass cloth reinforcement which is laminated together with a conductive layer in a single press lamination process.

The invention creates an electrically conductive element over a conductive pattern, on the surface of a multilayer core. This may be achieved, for example, by plating a layer of electroless copper over an inner layer circuit pattern, followed by masking and then plating of electrically conductive element.

A press lamination step is performed to laminate a dielectric layer and a conductive layer over the surface of a patterned layer that carries the electrically conductive element, so that the electrically conductive element protrudes beyond the surface of the added conductive layer. The lamination method using a press with compressible components over the electrically conductive elements can be used to laminate a prepreg layer with a copper foil onto the inner core.

A mechanical process is used to remove part of the conductive layer, the dielectric layer and portion of the conductive element to expose the electrically conductive element. Thereafter, an electrically conductive undercoat is to be formed on the surface of the dielectric layer. A circuit pattern is then formed over the electrically conductive undercoat.

The present invention may provide several advantages over the prior art for forming embedded electrically conductive elements in a multilayer circuit board. For instance, the method for forming embedded electrically conductive elements may be performed without the used of new equipment or new materials. A novel method of the present invention also provides an easy and reliable method to create interconnection-under-pad elements embedded in a multilayer circuit substrate.

Another aspect of the invention provides a process for forming embedded elements having a variety of shapes, sizes, and lengths that may permit more effective usage of a substrate space. For example, interconnection elements having various shapes (e.g., rectangular round, elliptical, linear, etc.) may couple two circuits in different layers of a multilayer substrate. This same technique may be used to form charge-retaining elements and/or electromagnetic shielding elements of various shapes and sizes.

A method is provided for making an electrically conductive element in a multilayer printed circuit board comprising: (a) providing a first substrate having a first surface, (b) forming a first conductive circuit pattern on the first surface of the first substrate, (c) forming a first electrically conductive element onto the first surface, (d) forming a first insulating layer and a first conductive layer over the first surface of the first substrate, the first conductive circuit pattern, and the first electrically conductive element, the first insulating layer positioned adjacent to the first surface, (e) removing a portion of the first insulating layer and a portion of the first conductive layer to expose at least one face of the first electrically conductive element, the first conductive layer and the exposed first electrically conductive element defining a second surface, and (f) forming a first electrically conductive undercoat layer over the second surface. Electrical continuity may be formed between the first conductive layer and the first electrically conductive element. In some implementations, the method may further include: (a) drilling a hole through the first electrically conductive element, (b) forming a second conductive circuit pattern over the first electrically conductive undercoat, and (c) electrically coupling the first electrically conductive element to at least one of either the first conductive circuit pattern or second conductive circuit pattern. Yet other steps may include: (a) applying a photo-resist layer over the first surface, the photo-resist defining an opening at the locations where the first electrically conductive element is to be formed, and (b) removing the photo-resist after the first electrically conductive element has been formed. The first insulating layer and the first conductive layer may be formed over the first surface of the first substrate by pressing the first insulating layer and the first conductive layer over the first surface of the first substrate so that approximately the same pressure is applied to the first electrically conductive element as well as the first surface, wherein the first electrically conductive element forms a protrusion on the first insulating layer and the first conductive layer. The first insulating layer and the first conductive layer may be formed over the first surface of the first substrate by (a) pressing the first insulating layer and over the first surface of the first substrate so that approximately the same pressure is applied to the first electrically conductive element as well as the first surface, the first insulating layer having a first exposed surface, and (b) seeding the first exposed surface with a conductive material to produce the first conductive layer.

In yet another feature of the invention, the first substrate has a third surface opposite the first surface, and further comprising: (a) forming a second conductive circuit pattern on the third surface, (b) forming an second electrically conductive element onto the second surface, the second electrically conductive element having a height greater than the height of the second conductive circuit pattern over the third surface, (c) forming a second insulating layer and a second conductive layer over the third surface of the first substrate, the second conductive circuit pattern, and the second electrically conductive element, the second insulating layer positioned adjacent to the third surface, (d) removing a portion of the second insulating layer and a portion of the second conductive layer to expose at least one face of the second electrically conductive element, the second conductive layer and the exposed second electrically conductive element defining a fourth surface, and (e) forming a second electrically conductive undercoat layer over the fourth surface. The first and second electrically conductive elements may be formed simultaneously on the opposing first and third surfaces. The method may further comprise electrically coupling the first electrically conductive element to one or more electrical circuits below, above, or at either end of the first electrically conductive element. The first electrically conductive element may be configured to operate as an electromagnetic shield or as an energy storage device. The first electrically conductive element may include at least one of an electrically conductive metal, an electrically conductive adhesive, or an electrically conductive paste. In various implementations, the electrically conductive metal includes at least one material from the group consisting of: iron, nickel, tin, aluminum, indium, lead, gold, silver, bismuth, copper, and palladium. The method may further include simultaneously forming a plurality of electrically conductive elements on the first surface, at least two of the plurality of electrically conductive elements having different shapes. The first electrically conductive element may be formed to have one of an elliptical shape, a rectangular shape, a square shape, L-shape, T-shape, or cross-shape. The first substrate may be flexible and includes one or more layers of a dielectric material. The first conductive circuit pattern may be one of a flexible circuit, a printed circuit, metal-based printed circuit, or combination thereof. Additionally, the first electrically conductive element may be formed by one of electro-deposition of a metal, deposition of conductive adhesive, or electro-deposition followed by etching out of electrically conductive material. The first electrically conductive element may have a height greater than the combined thickness of the first insulating layer and the first conductive layer.

Another aspect of the invention provides a multilayer printed circuit board comprising: (a) a first substrate having a first surface, (b) a first conductive circuit pattern formed on the first surface of the first substrate, (c) a first electrically conductive element formed on the first surface of the first substrate, (d) an first insulating layer formed over the first surface of the first substrate, covering the first conductive circuit pattern, and surrounding the first electrically conductive element, (e) at least one face of the first electrically conductive element is exposed through the first insulating layer element, and/or (f) a second conductive circuit pattern formed over the first insulating layer, wherein the first conductive element interconnects the first conductive circuit pattern and the second conductive circuit pattern.

DETAILED DESCRIPTION

In the following description numerous specific details are set forth in order to provide a thorough understanding of the invention. However, one skilled in the art would recognize that the invention might be practiced without these specific details. In other instances, well known methods, procedures, and/or components have not been described in detail so as not to unnecessarily obscure aspects of the invention.

In the following description, specific details are given to provide a thorough understanding of the embodiments. However, it will be understood by one of ordinary skill in the art that the embodiments may be practiced without these specific detail. For example, circuits or processes may be shown in simplified diagrams in order not to obscure the embodiments in unnecessary detail. In other instances, well-known circuits, structures, processes and techniques may not be described in detail so as not to obscure the embodiments.

One aspect of the present invention to provides a method for building an electrically conductive element in a dielectric layer which is part of a multilayer printed circuit board. In contrast to the prior art, which creates electrical interconnections (e.g., electrically conductive elements) between layers by either drilling a via and then plating it or using a stud to perforate through a resin dielectric layer, the present invention builds the layers around the electrical interconnections. Such method provides high density interconnection boards with a cost effective fabrication of interconnections without the use of sophisticated machines, such as laser drilling, and plasma etching or specialty material, such as photoimagable dielectric, or use of difficult processes, such as control depth micro-drilling, during the creation of layer-to-layer interconnections. The associated simplicity of this process and the improved assurance in interconnection reliability may improve the manufacturing process of high interconnection-density multilayer circuit boards.

Another aspect of the present invention provides a method for designing a dielectric layer having electrically conductive elements of various shapes, lengths, and sizes that are suitable for use as interconnections, charge storage, and/or electromagnetic shielding.

Additionally, a method for creating interconnection elements below a mounting pad of a multilayer circuit board is provided. This concept uses the surface space of a multilayer circuit board as well as the area below component pads on the surface for separate electrical connections. That is, conductive elements are formed within inner layers but do not extend to outer layers. In this way, a circuit board can be drastically reduced to a size just sufficient for mounting all the desired components.

One feature of the invention is that it can be practiced in a process where a standard glass cloth reinforced prepreg dielectric layer can be employed instead of a pure resin dielectric. Additionally, the present invention does not need a separate step to create the conductive layer over the dielectric surface since this is done in a single pressing step.

Another novel feature is that the embedded electrically conductive elements do not need to have a substantially uniform height for performing this process. Additionally, the present method does not require that the electrically conductive elements have a conical shape. In fact, the electrically conductive elements may have various shapes, sizes and forms.

FIGS. 1-11 are exemplary schematics illustrating a cross-sectional view of a multilayer circuit board on which electrically conductive elements (e.g., studs, vias, etc.) embedded in a dielectric layer are formed. Instead of drilling and plating to create a via or using a pre-formed stud to interconnect circuits on two layers, the present invention forms the electrical interconnections (e.g., electrically conductive elements) as part of forming the multilayer circuit board. In particular, the electrical interconnections are built into the multilayer circuit board. One use of such embedded conductive elements is for connecting two or more circuits running on two or more different layers in a multilayer printed circuit board.

As used throughout this document, the term "multilayer core" and/or "substrate" refer generally to substrates of dielectric layers, insulating layers, or other equivalent materials which may have conductive patterns or traces that form a circuit or electrical network having single or multiple layers of conductive traces, pads or other electrically conductive pathways, sitting between the dielectric layers. The dielectric material employed may be either rigid or flexible, and formed from one or more layers. Some typical multilayer cores include flexible circuits, one or more layers of a printed circuit board, two or more circuit layers with connecting holes, one or more layers of printed circuits with embedded passives components, and/or one or more layers of printed circuits or conductive with embedded integrated circuits.

Figure 1:
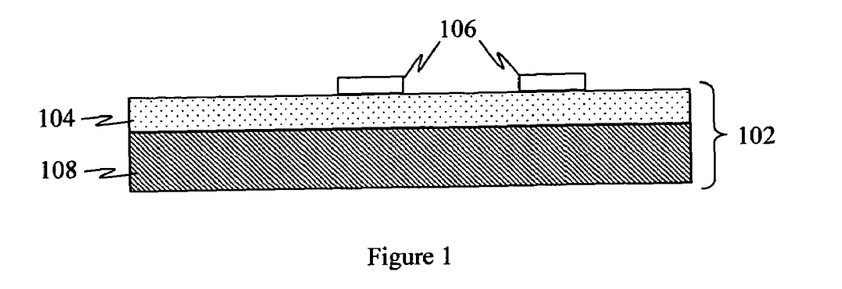
FIG. 1 illustrates a cross-sectional view of a first substrate having a multilayer core according to one embodiment of the invention.

FIG. 1 illustrates a cross-sectional view of a first substrate 102 having a multilayer core according to one embodiment of the invention. The first substrate 102 includes an outermost dielectric layer 104 with a conductive circuit pattern 106 on one side and one or more cores of multilayer printed wiring circuits 108 on the other side. In some embodiments, the multilayer core 102 may be a four layer circuit board core with the conductive circuit pattern 106 formed from conventional copper foil. The thickness of this conductive circuit pattern 106 may be approximately 17 microns, for example.

Figure 2:
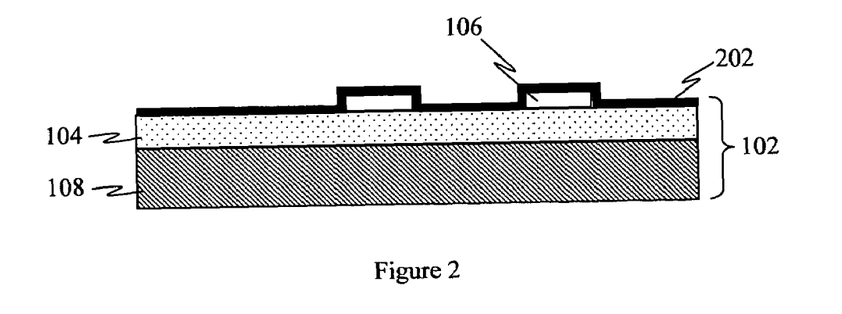
FIG. 2 illustrates a cross-sectional view of an electrically conductive undercoat applied over a dielectric layer and a conductive circuit patterns.

FIG. 2 illustrates a cross-sectional view of an electrically conductive undercoat 202 applied over the dielectric layer 104 and the conductive circuit patterns 106. The electrically conductive undercoat 202 provides a means for electric current to flow to an opening (e.g., stud or via hole) formed on the dielectric layer 104 that receives an electrically conductive element. In some implementations, the electrically conductive undercoat 202 is an electroless copper, approximately 1.5 microns thick.

Instead of using an electroless copper process, other method metallization processes may be used to form electrically conductive undercoat 202. For example, a direct metallization process using an electrolytic plating process may be used to form the electrically conductive undercoat (e.g., employing a Cuprostar LP-1 process by Enthone-OMI). Other direct metallization processes, such as Black Hole® direct plating process by MacDermid, may also be employed.

Figure 3:
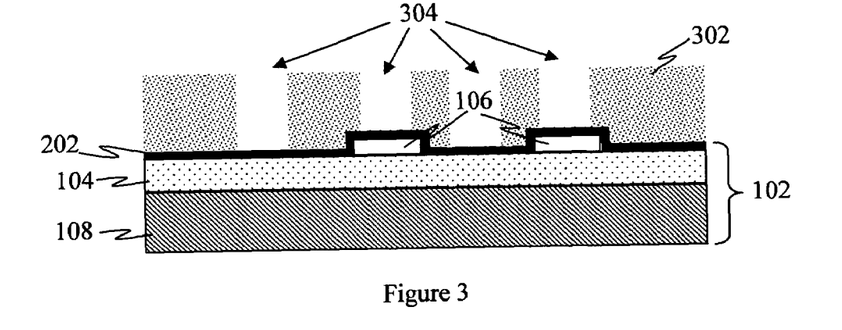
FIG. 3 illustrates a cross-sectional view of the first substrate with a photoresist applied over the conductive undercoat, forming an opening over the locations where the electrically conductive elements are supposed to be located.

FIG. 3 illustrates a cross-sectional view of the first substrate 102 with a photoresist 302 applied over the undercoat 202, forming one or more openings 304 over the locations where the electrically conductive elements are supposed to be located. These openings 304 may be formed by first depositing a layer of light sensitive material, such as photoresist 302, and using light exposure or shielding to form the openings 304 at the expected locations of the electrically conductive elements. The photoresist 302 may be, for example, Dry Film 9000 series by Dupont. It should be noted that not all the openings 304 need to fall onto the conductive circuit patterns 106. For example, two of the opening 302 fall outside the conductive circuit patterns 106, sitting instead over a zone occupied by the dielectric layer 104.

Figure 4:
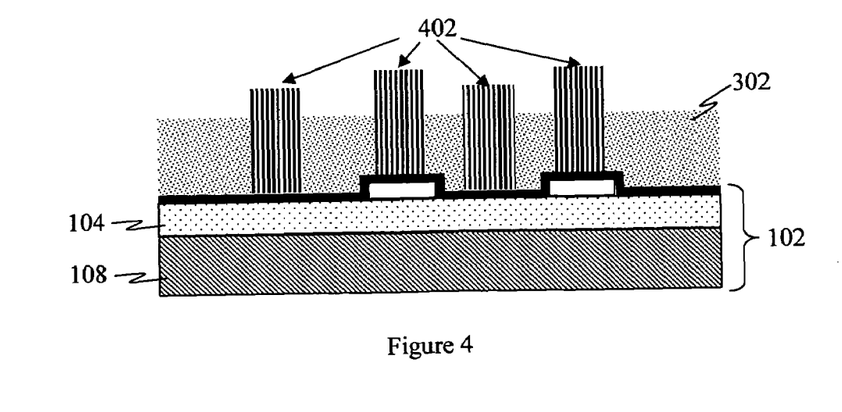
FIG. 4 illustrates a cross-sectional view of the first substrate with an electrically conductive material deposited into the openings created by the photoresist to form electrically conductive elements.

FIG. 4 illustrates a cross-sectional view of the first substrate 102 with an electrically conductive material deposited into the openings 304 created by the photoresist 302 to form electrically conductive elements 402. An electroplating process may be employed to deposit the conductive material in the openings 304 since the base of the openings 304 is electrically connected by means of the electrically conductive undercoat 202. In some implementations, an electroplating process was employed, for example, to plate copper using the plating additive Copper Gleam 125-T by Rohm and Hans. The electrically conductive elements 402 may have different heights (e.g., 60 to 200 microns), mainly due to electric field distributions during the electroplating process. Unlike the prior art, the present invention functions the same, without any additional processing necessary, whether or not the electrically conductive elements 402 have substantially uniform in height or not. In some embodiments, the electrically conductive elements may be formed by electro-deposition of a metal, deposition of conductive adhesive, and/or electro-deposition followed by etching out of electrically conductive material.

In some implementations, the electrically conductive elements may include an electrically conductive metal, an electrically conductive adhesive, and/or an electrically conductive paste. The electrically conductive metal may include iron, nickel, tin, aluminum, indium, lead, gold, silver, bismuth, copper, and/or palladium.

Figure 5:
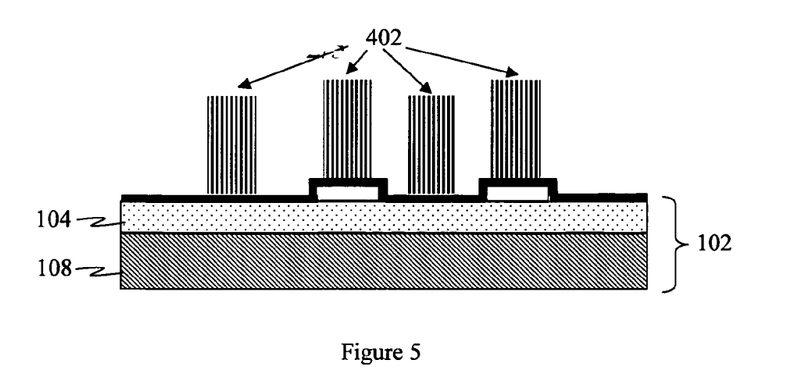
FIG. 5 illustrates how the photoresist is removed from the surface of the electrically conductive undercoat.

FIG. 5 illustrates how the photoresist 302 is removed from the surface of the electrically conductive undercoat 202. A dry film stripper, such as Resiststrip (e.g., RR10) by Atotech for example, can be used to remove the photo-resist 302. This dry film stripping process may be performed using a diluted sodium hydroxide solution.

Figure 6:
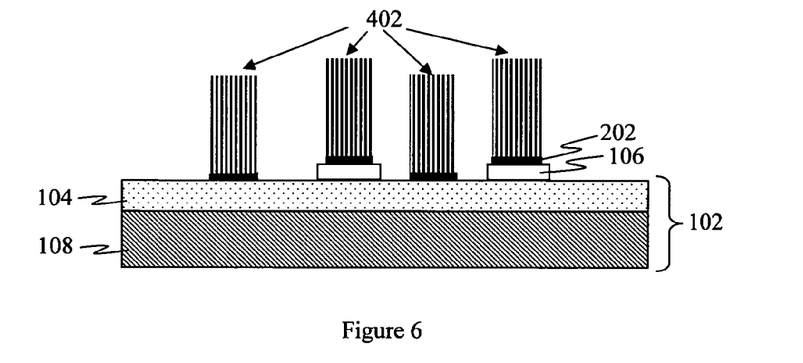
FIG. 6 illustrates the resulting electrically conductive elements after removal of the exposed electrically conductive undercoat.

FIG. 6 illustrates the resulting electrically conductive elements 402 after removal of the exposed electrically conductive undercoat 202. Note that the portions of the electrically conductive undercoat 202 below the electrically conductive elements 402 remains. When electroless copper is used as the conductive undercoat 202, it may removed by a microetching solution (e.g., 100 grams/liter sodium persulphate, and 50 grams/liter sulphuric acid).

The method used to remove the electrically conductive undercoat 202 depends on the nature or composition of the undercoat 202. For example, if a conductive polymer is employed in the undercoat 202, after using a microetch solution to remove the plated copper, a strong oxidizing agent, such as potassium permanganate, may be used. In another example, if a carbon process is used in the undercoat 202, after using a microetched solution to remove the plated copper, a pumice powder is sprayed to knock off the carbon particles.

Another method for forming the electrically conductive elements 402 may include printing a conductive paste onto the electrically conductive undercoat 202 followed by curing. In order to achieve the desired height for the electrically conductive elements 402, several prints of the conductive paste may be necessary. This is undesirable in that it consumes time and manufacturing resources and the printing process is susceptible to problems such smearing if not properly controlled.

The electrically conductive elements 402 may also be plated into a thick layer of copper which is then etch out to create the electrically conductive elements 402. In practice, a lot of copper would need to be plated and a significant portion of it would then need to be removed by etching. This results in a significant material wastage.

Figure 7:
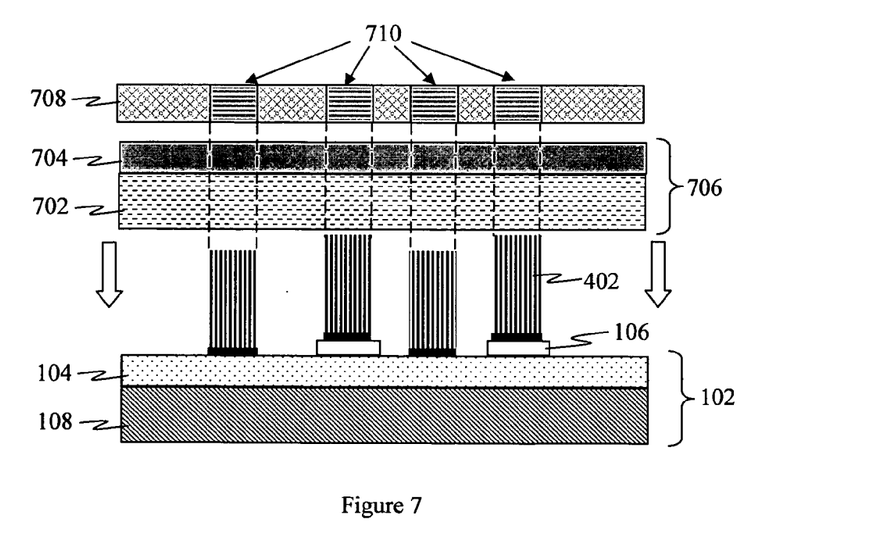
FIG. 7 illustrates a cross sectional view of the first substrate and a second substrate, including an insulating layer and a conductive layer, positioned over the first substrate prior to a multilayer lamination pressing.

FIG. 7 illustrates a cross sectional view of the first substrate 102 and a second substrate 706, including an insulating layer 702 and a conductive layer 704, positioned over the first substrate prior to a multilayer lamination pressing. In some implementations, the conductive layer 704 may be a resin coated copper foil and the insulating layer 702 may be a prepreg (e.g., a pure resin with standard glass cloth reinforcement, 1080 prepreg by Nelco combined with a half oz copper foil by Mitsui, etc.). The press plate above the second substrate 706 has to be able to evenly distribute the press pressure. The goal is to ensure that the electrically conductive elements 402 form protrusions on the second substrate 706 after the two substrates 102 and 706 are pressed together. However, the multilayer core material in the first substrate 102 may be softened during the press process, since the press lamination temperature is greater than the glass transition temperature (Tg) of the insulating material 702. The electrically conductive elements 402 stand higher than the surrounding surface, where there is no embedded electrically conductive element. For example, the electrically conductive elements may have a height greater than the combined thickness of the insulating layer 702 and/or the conductive layer 704. If pressure was exerted under conventional conditions, the electrically conductive elements may "sink" into the softened multilayer core of the first substrate 102.

To address this situation, the press plate 708 above the second substrate 706 is configured to compress more at those zones above an electrically conductive element than at other zones where no electrically conductive elements are located. In some implementations, the press plate 708 above the second substrate 706 may include holes or compression-pads 710 in locations corresponding to the electrically conductive elements 402. The holes or compression pads may be the same size or larger than the size of the electrically conductive elements 402. The compression pads 710 may be independently controlled to compress less or more so that the pressure applied to the electrically conductive elements 402 may be approximately the same as the pressure applied to the remaining zones where there are no electrically conductive elements. The press plate 708 may be configured to compress less in those zones where there are no electrically conductive elements. By maintaining substantially the pressure the same across the electrically conductive elements 402 and the remaining zones over the first substrate 102, the electrically conductive elements 402 are pressed into the second substrate 706 and form protrusions (shown in FIG. 8).

Figure 10:
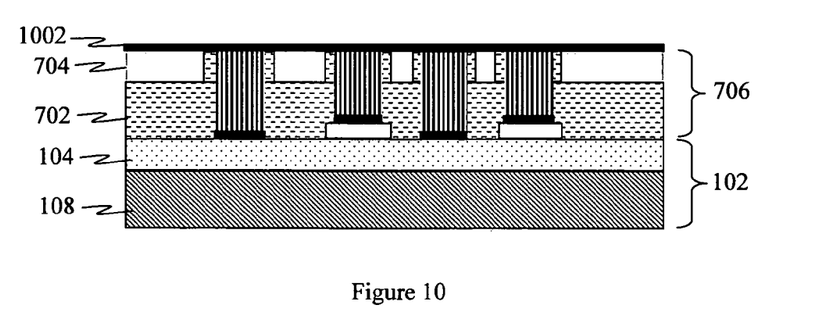
FIG. 10 illustrates a cross-sectional view of the resulting circuit board layers with an electrically conductive undercoat applied over a second surface.

Note that, the present invention creates the conductive layer 704 over the dielectric layer 702 surface in the same step. A conventional pressing technology to press dielectric and copper foil together may be employed. It is marginally easier to expose the embedded conductive elements 402 if the conductive layer 704 (e.g., conductive foil) is not used but this marginal gain is not sufficient to offset the additional process in pressing without the use of the conductive layer 704 and in seeding the dielectric surface for a conductive undercoat layer 1002 (FIG. 10).

Figure 8:
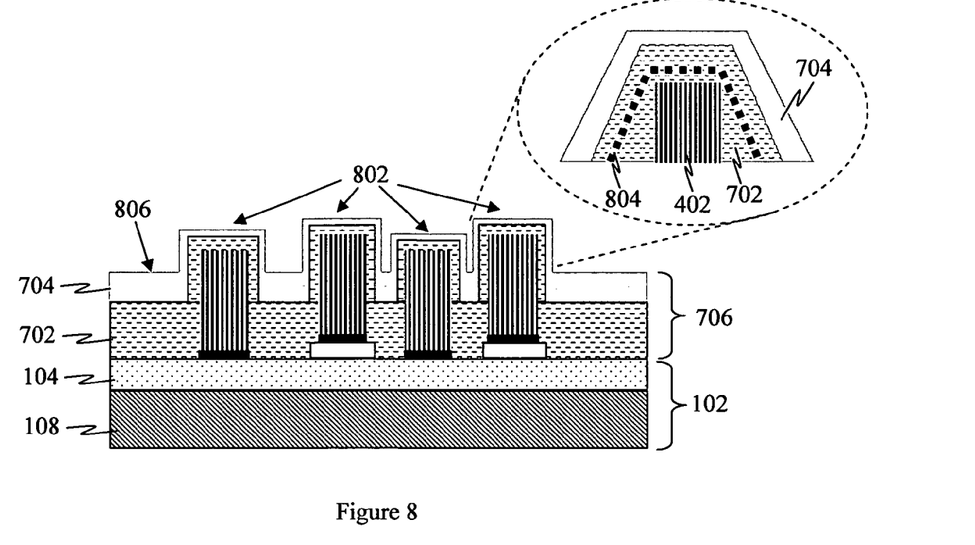
FIG. 8 illustrates a cross-sectional view of the resulting circuit board layers after pressing of the first and second substrates with protrusions or bumps over the embedded conductive elements.

FIG. 8 illustrates a cross-sectional view of the resulting circuit board layers after pressing of the first and second substrates 102 and 706 with protrusions or bumps 802 over the embedded conductive elements 402. In practice, a cross-sectional view of these protrusions would show an electrically conductive element embedded in an insulating layer after press lamination. The upper portion of the electrically conductive elements 402 stand well above the insulating layer 702 and the electrically conductive layer 704. The electrically conductive elements 402 do not necessarily penetrate a glass cloth reinforcement layer 804 in the insulation layer 702. The glass cloth reinforcement 804 in the insulating layer 702 stays above the electrically conductive element 402. The resin from the insulation layer 702 flows down to the base of the electrically conductive elements 402. By this process, the present invention does not require using conical-shaped bumps as in the prior art since the interconnecting conductive elements 402 do not need to penetrate the reinforcing material 804 in the insulating layer 702.

Figure 9:
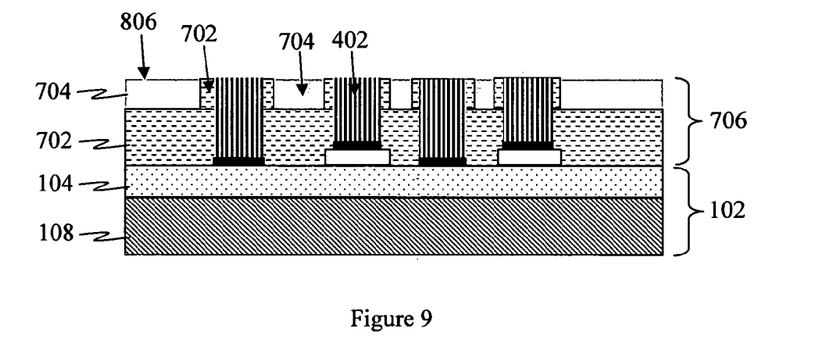
FIG. 9 illustrates a cross-sectional view of the resulting circuit board layers after a mechanical means, such as sanding or brushing, has been applied to the top surface of the second substrate to plane it.

FIG. 9 illustrates a cross-sectional view of the resulting circuit board layers after a mechanical means, such as sanding or brushing, has been applied to the top surface 806 of the second substrate 806 to plane it. This removes a portion of the conductive layer 704, a portion of the insulating layer 702 and a portion of electrically conductive elements. This results in the second surface 806 having the second conductive layer 704 and some portion of second insulating layer 702. Unlike the prior art, because the resulting circuit board is planed, the present invention functions the same whether or not the electrically conductive elements 402 have substantially uniform in height or not. That is, it makes no difference whether the electrically conductive elements 402 have the same height when formed since the second surface 806 is planed or substantially flattened so that the height of the electrically conductive elements 402 are evened.

In alternative implementations, the second conductive layer 704 may be etched away before mechanically brushing or sanding the remaining surface to plane it. This may be used where the multilayer board manufacturing process can add an electrically conductive undercoat directly on the bare dielectric or insulating layer 702 surface. Alternatively, the mechanical brushing may be performed prior to etching of the second conductive layer 704. However, the downside to this method is that brushing the second conductive layer 704 is more difficult and performing the etching process after brushing simultaneously attacks the second conductive layer 704 and the exposed portions of the electrically conductive elements 402.

In yet another alternative embodiment, second substrates 706 does not include the second conductive layer 704 when it is pressed to the first conductive layer. The top surface of the second substrate (insulating layer 702) is then planed by brushing or sanding. This may be an appropriate process where a layer of electrically conductive undercoat can be added directly to the planed surface of the second insulating layer 702. This method has the advantage of avoiding the use of the second conductive layer 704. However, a release film may be necessary, which would need to be removed from the insulating layer 702 in a subsequent step.

FIG. 10 illustrates a cross-sectional view of the resulting circuit board layers with an electrically conductive undercoat 1002 applied over the second surface 806. The electrically conductive undercoat 1002 may be electroless copper plating. Other known direct metallization processes, such as conductive polymer followed by an electroplating process of copper, may also be employed. In some implementations, the electrically conductive undercoat 1002 over the second surface 806 may be a deposition of a metal layer, a deposition of a layer of conductive polymer, a layer of carbon or carbon equivalent, a combination thereof.

Figure 11:
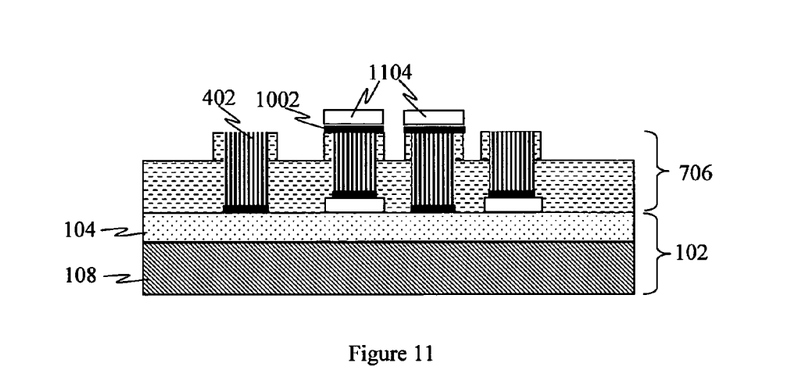
FIG. 11 illustrates a cross-sectional view of circuit patterns is formed over the electrically conductive undercoat.

FIG. 11 illustrates a cross-sectional view of circuit patterns 1104 is formed over the electrically conductive undercoat 1002. The circuit patterns 1104 may be formed in numerous ways. For example, a photoimagable resist (e.g., Du Pont 9000 series) may be used to laminate the electrically conductive undercoat 1002. An image of the circuit pattern is transferred onto the surface of the electrically conductive undercoat 1002. This is then plated with copper and tin, before removing the photoimagable resist and etching away the unwanted copper, to form the desired circuit pattern 1104.

In some implementations, the electrically conductive elements 402 may be mechanically drilled after substrate surface 806 is planed (e.g., by sanding or brushing), prior to coating the surface with an electrically conductive undercoat 1002. The drilled holes may then be plated as through-holes or vias.

In various embodiments, the conductive circuit patterns 106 and/or 1104 may be formed by (a) electro-deposition of a metal layer (e.g., masking by the employment of a resist layer over circuit pattern and followed by etching of the unmasked metal layer), (b) masking by the employment of resist layer over non-circuit pattern followed by electro-deposition of a metal layer and an etch resist metal layer and further followed by unmasking and removal of the second conductive layer and the conductive undercoat, (c) forming an electro-deposition of a metal layer, masking by employment of resist layer over non-circuit pattern, further electro-deposition of metal layer and an etch resist metal layer and further followed by unmasking and removal of the conductive undercoat and the second electrically conductive layer, or (d) any other known method for forming a circuit pattern over an electrically conductive surface.

While the examples illustrated in FIGS. 1-11 describe a process for creating electrically conductive elements on one side of the first substrate 102, the same process may be applied to two sides of the first substrate 102 to form embedded electrically conductive elements on both sides of the first substrate. These electrically conductive elements on both sides of the first substrate 102 may be formed together or at the same time.

Another feature of the invention provides for stacking a plurality of the resulting multilayer substrate illustrated in FIG. 11. That is, once a circuit pattern 1104 is formed over electrically conductive elements 402 (as in FIG. 11), this resulting substrate can be used as a multilayer core or substrate 108 illustrated in FIG. 1 and the entire process may be repeated to add more substrate layers, circuits and electrically conductive elements.

Another feature of the invention provides for electrically conductive elements (e.g., such as elements 402) of different shapes and lengths. While various illustrations show the electrically conductive elements 402 as a column-shaped conductor, the electrically conductive element 402 may be formed having different shapes, sizes and/or lengths.

U.S. Pat. No. 6,713,685 discloses the use of laser ablation or plasma ablation, and/or micro-milling to create non-circular vias on a substrate. However, the present invention avoids these costly and/or time consuming methods of creating vias. Instead, the present invention creates electrically conductive elements 402 by means of image transfer. For example, as illustrated in FIG. 3, openings 304 for the electrically conductive elements may be formed by transferring an image onto a photoresist and then removing the photoresist over the openings 304. The electrically conductive elements 402 may then be electroplated or deposited into the openings 304. This means that in a single image transfer step a circular-shaped, a T-shaped or any other shape of elements 402 can be transferred together or at the same time without any additional work. Thus, electrically conductive elements of various shapes, such as round, eclipse, I-shaped, T-shaped, L-shaped, *-shaped, or any other shape, can be created by this process. Note that additional shapes of the electrically conductive elements 402 may also be created by a multistage image transfer process on the photoresist layer 302. That is, openings of various dimensions, shapes, and/or sizes may be formed by a multistage process on the photoresist 302. This may permit the creation of electrically conductive elements 402 having different dimensions at different heights.

Figure 12:
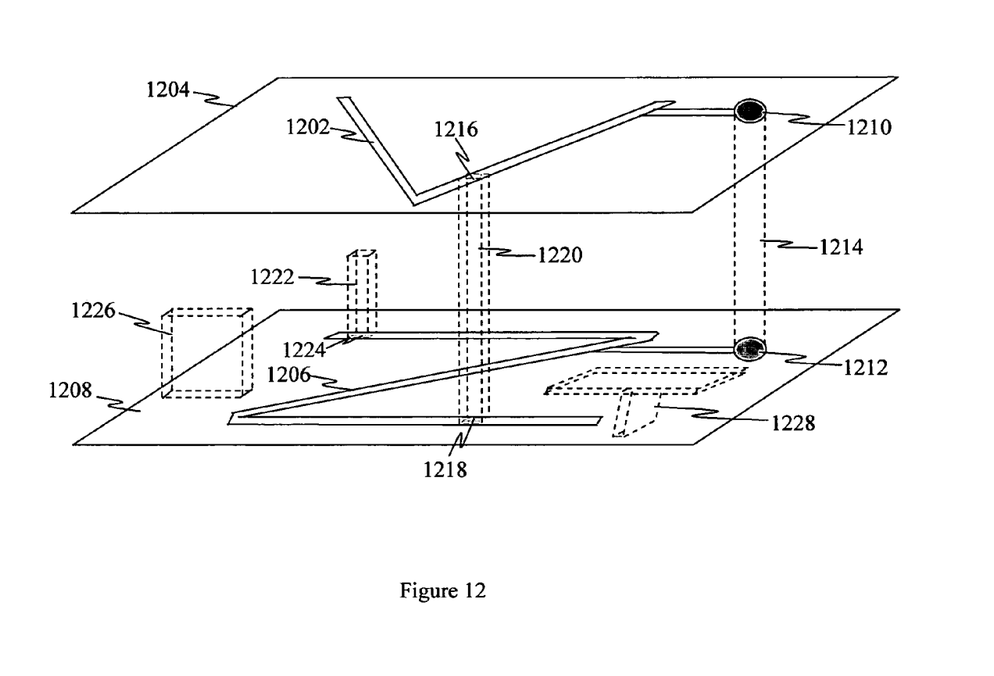
FIG. 12 illustrates various shapes and types of electrically conductive elements that may be formed between different layers of a multilayer circuit board.

FIG. 12 illustrates various shapes and types of electrically conductive elements that may be formed between different layers of a multilayer circuit board. Consider the case where a first circuit 1202 on a first layer 1204 is to be connected to a second circuit 1206 on a second layer 1208. The conventional techniques would route both circuits 1202 and 1204 to corresponding locations on each layer 1204 and 1208 where an interconnecting pad 1210 and 1212 can be formed for each circuit 1202 and 1206 and where a through-via or stud interconnection element 1214 can connect both pads 1210 and 1212. Such routing to a pad location 1210 ad 1212 is typically necessary since the pads tend to have a larger diameter than the width of the traces in the first and second circuits 1202 and 1206. Additionally, the interconnecting element 1214 between the first and second circuits 1202 and 1206 may need to couple to interconnecting pads 1210 and 1212 that have sufficient size to provide a proper electrical connection. Thus, the typically thin traces on the circuits 1210 and 1212 may not provide a proper connection point when using a circular stud or via conducting element 1214.

Assuming that the first and second circuits 1202 and 1206 intersect each other in a corresponding location of the first and second layers 1204 and 1208, the present invention can use an elongated rectangular-shaped conductive element 1220 to interconnect both circuits 1202 and 1206. That is, the elongated rectangular-shaped conductive element 1220 may be approximately the same width as the circuit traces on circuits 1202 and 1206 which provide proper connection points 1216 and 1218.

Another aspect of the present invention provides embedded elements that serve to store a charge. The electrical element 1222 in this case may only make contact 1224 with one circuit layer 1208. The electrical element 1222 can be formed using the same process previously described to form electrically conductive elements.

Other implementations of the present invention may provide electromagnetic shielding between multilayered circuits. An embedded shielding element 1226 or 1228 may be formed according to the process previously described to form electrically conductive elements. The embedded shielding element 1226 or 1228 may serve to shield traces and/or electrical components on a first layer 1204 from the effects of electrical interference and/or magnetic fields originating from the first layer 1204 or other layers 1208. In some implementations, the shielding element 1226 or 1228 may be coupled to a ground point or it may not be connected any circuit, electrical connection, or ground. Note that the shielding elements 1226 and 1228 may be formed horizontal/parallel and/or vertical/perpendicular to the plane of the layers 1204 and 1208 to provide the desired shielding. Other orientations for the shielding elements 1226 and 1228 are also possible with the present invention.

Figure 13:
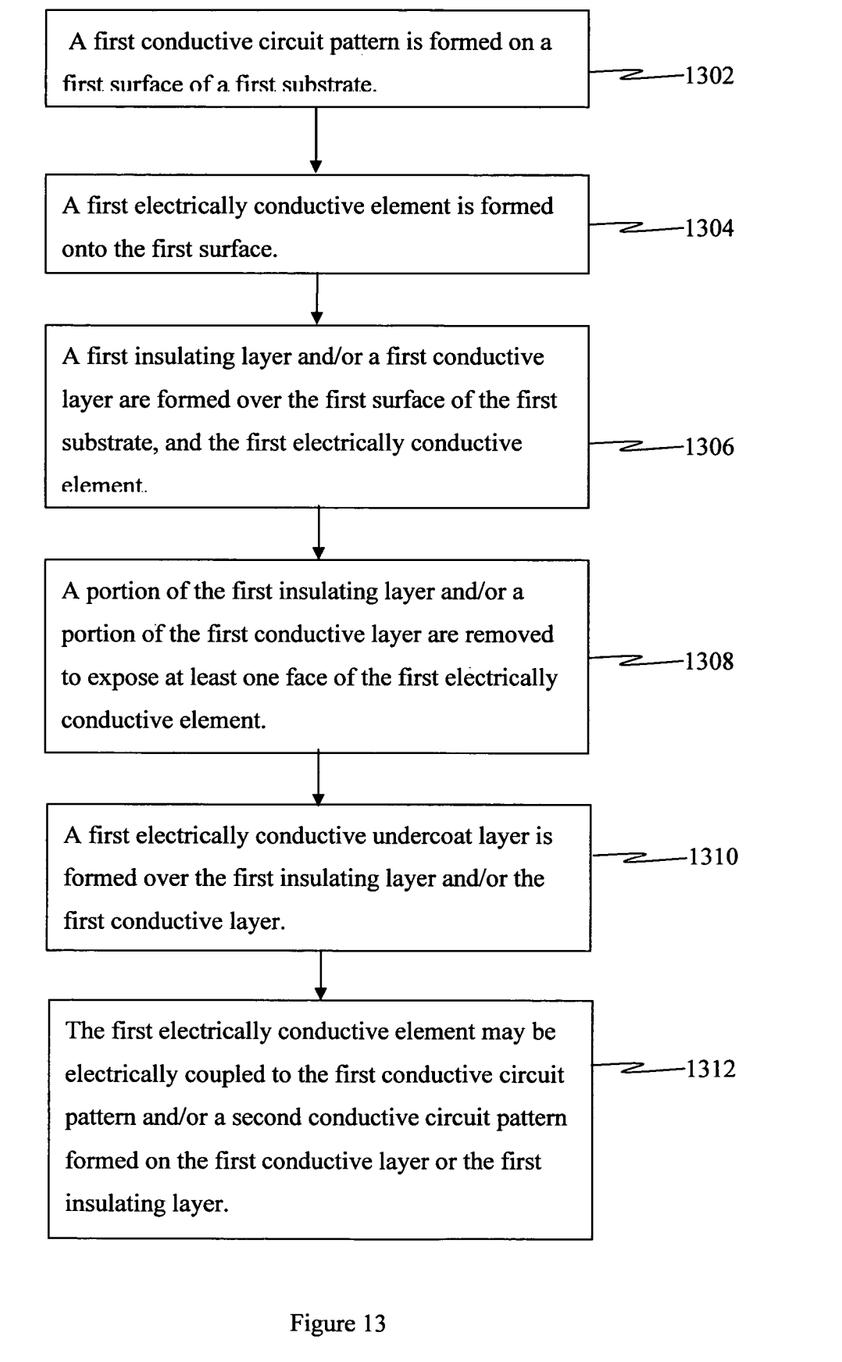
FIG. 13 describes a method for forming embedded electrically conductive elements as part of the process of forming or building a multilayer circuit board.

FIG. 13 describes a method of forming embedded electrically conductive elements as part of the process of forming or building a multilayer circuit board. A first conductive circuit pattern is formed on a first surface of a first substrate 1302. A first electrically conductive element is formed onto the first surface 1304 with a first insulating layer and/or a first conductive layer formed over the first surface of the first substrate, the first conductive circuit pattern, and the first electrically conductive element 1306. A portion of the first insulating layer and/or a portion of the first conductive layer are removed to expose at least one face of the first electrically conductive element 1308. A first electrically conductive undercoat layer is formed over the first insulating layer and/or the first conductive layer 1310.

The first electrically conductive element may be electrically coupled to the first conductive circuit pattern and/or a second conductive circuit pattern formed on the first conductive layer or the first insulating layer 1312. A hole may be drilled through the first electrically conductive element if a via is desired. Note that these steps may be performed in various orders or sequences without departing from the invention.

In forming the first electrically conductive element a photo-resist layer may be applied over the first surface, the photo-resist defining an opening at the locations where the first electrically conductive element is to be formed. The photo-resist is removed after the first electrically conductive element has been formed.

The first insulating layer and/or the first conductive layer may be formed over the first surface of the first substrate by pressing the first insulating layer and/or the first conductive layer over the first surface of the first substrate so that approximately the same pressure is applied to the first electrically conductive element as well as the first surface. The first electrically conductive element may form a protrusion on the first insulating layer and/or the first conductive layer. Alternatively, the first conductive layer may be formed by seeding a first exposed surface of the first insulating layer with a conductive material.

In some implementations, one or more electrically conductive elements may be formed on a second surface opposite the first surface of the first substrate. That is, the same process may be implemented sequentially or simultaneously on the second surface of the first substrate to form one or more electrically conductive elements.

Additionally, a plurality of electrically conductive elements may be formed on the first surface simultaneously, where at least two of the plurality of electrically conductive elements have different shapes, such as an elliptical shape, a rectangular shape, a square shape, L-shape, T-shape, or cross-shape.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications are possible. Those skilled, in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A method for making an electrically conductive via in a multilayer printed circuit board comprising:

providing a first substrate including a dielectric layer, the first substrate having a first surface;

forming a first conductive circuit pattern on the first surface of the first substrate;

forming a first electrically conductive via onto the first surface such that the first electrically conductive via is exposed and extends a distance above the first surface of the first substrate;

forming an insulating layer and a conductive layer over the first surface of the first substrate, the first conductive circuit pattern, and the first electrically conductive via, the insulating layer positioned adjacent to the first surface, wherein the first electrically conductive via is formed prior to and independent of forming the insulating layer and the conductive layer; and planning across a partial thickness of at least one of the insulating layer or the conductive layer to expose at least one end of the first electrically conductive via, where the conductive layer and the exposed first electrically conductive via define a second surface.

2. The method of claim 1 further comprising:

forming a first electrically conductive undercoat layer over the second surface;

forming a second conductive circuit pattern over the first electrically conductive undercoat layer; and electrically coupling the first electrically conductive via to at least one of either the first conductive circuit pattern or second conductive circuit pattern.

3. The method of claim 1 further comprising:

applying a photo-resist layer over the first surface, the photo-resist defining an opening at the location where the first electrically conductive via is to be formed; and removing the photo-resist after the first electrically conductive via has been formed.

4. The method of claim 1 wherein forming the insulating layer and the conductive layer over the first surface of the first substrate causes a protrusion to be formed by the first electrically conductive via pushing on the insulating layer and the conductive layer, the protrusion rising above the second surface and away from the first surface, where the insulating layer and the conductive layer are further formed by pressing the insulating layer and the conductive layer over the first surface of the first substrate so that approximately the same pressure is applied to the protrusion of the first electrically conductive via as well as the first surface.

5. The method of claim 1 wherein forming the insulating layer and the conductive layer over the first surface of the first substrate causes a protrusion to be formed by the first electrically conductive via pushing on the insulating layer and the conductive layer, where the insulating layer and the conductive layer are further formed by
  pressing the insulating layer and over the first surface of the first substrate so that approximately the same pressure is applied to the protrusion of the first electrically conductive via as well as the first surface, the insulating layer having an exposed surface; and
  seeding the exposed surface with a conductive material to produce the conductive layer.

6. The method of claim 1 wherein the first substrate has a third surface opposite the first surface, and further comprising:
  forming a second conductive circuit pattern on the third surface;
  forming an second electrically conductive via onto the second surface such that the second electrically conductive via is exposed and extends a distance above the third surface of the first substrate, the second electrically conductive via having a height greater than the height of the second conductive circuit pattern over the third surface;
  forming a second insulating layer and a second conductive layer over the third surface of the first substrate, the second conductive circuit pattern, and the second electrically conductive via, the second insulating layer positioned adjacent to the third surface, wherein the second electrically conductive via is formed prior to and independent of forming the second insulating layer and the second conductive layer;
  planning across a partial thickness of at least one of the second insulating layer or the second conductive layer to expose at least one end of the second electrically conductive via, where the second conductive layer and the exposed second electrically conductive via define a planar fourth surface.

7. The method of claim 6 wherein the first and second electrically conductive vias are formed simultaneously on the opposing first and third surfaces.

8. The method of claim 1 further comprising:
  electrically coupling the first electrically conductive via to one or more electrical circuits below, above, or at either end of the first electrically conductive element.

9. The method of claim 1 wherein the first electrically conductive via includes at least one of an electrically conductive metal, an electrically conductive adhesive, or an electrically conductive paste.

10. The method of claim 1 further comprising:
  simultaneously forming a plurality of electrically conductive vias on the first surface, at least two of the plurality of electrically conductive vias having different shapes.

11. The method of claim 1 wherein the first conductive circuit pattern is one of a flexible circuit, a printed circuit, metal-based printed circuit, or combination thereof.

12. The method of claim 1 wherein the first electrically conductive via is formed by one of electro-deposition of a metal, deposition of conductive adhesive, or electro-deposition followed by etching out of electrically conductive material.

13. The method of claim 1 wherein the first electrically conductive via has a height greater than the combined thickness of the insulating layer and the conductive layer.

14. The method of claim 1, further comprising:
  including a reinforcement layer within the insulating layer.

15. The method of claim 1 wherein the first conductive via extends a distance beyond a top planar surface of the conductive layer after the first insulating layer and conductive layer are formed.

16. The method of claim 1, wherein the first conductive via is a discrete element that extends through at least the insulating layer, and the insulating layer being parallel to the conductive layer.

17. The method of claim 1, wherein, after removing a portion of the insulating layer and a portion of the conductive layer, the first conductive element is electrically isolated from the conductive layer by the insulating layer as the first conductive via extends to the second surface.

18. The method of claim 1 wherein the first electrically conductive via is formed by:
  depositing a first layer of light sensitive material on the first surface;
  forming a first opening in the first layer by exposing a portion of the light sensitive material to light;
  forming the first electrically conductive via in the first opening of the first layer; and
  removing the remaining first layer to expose the electrically conductive via.

19. The method of claim 1, wherein a protrusion formed by the first electrically conductive via pushing on the insulating layer and the conductive layer, the protrusion rising above the second surface and away from the first surface, and the planning of the at least one of the insulating layer or the conductive layer removes the protrusion to expose one end of the first electrically conductive via.

20. The method of claim 1, wherein prior to forming the insulating layer and the conductive layer, the method further comprising:
  forming a passive conductive element on the first surface such that the passive conductive element is exposed and extends a distance above the first surface of the first substrate, the passive conductive element being formed concurrent with the first electrically conductive via.

21. The method of claim 20, wherein the passive conductive element is one of electro-magnetic shield or an energy storage device.

22. The method of claim 20, wherein the passive conductive element is formed to have one of an elliptical shape, a rectangular shape, a square shape, L-shape, T-shape, or cross-shape.

23. The method of claim 1, wherein the first electrically conductive element is electrically isolated from the conductive layer by the insulating layer.

* * * * *